(12) United States Patent
Bhaskaran et al.

(10) Patent No.: US 11,074,967 B2
(45) Date of Patent: Jul. 27, 2021

(54) LOW-POWER AND HIGH-DENSITY CORE-POWER LOWERING FOR MEMORY WRITE ASSIST

(71) Applicant: QUALCOMM Incorporated, San Diego, CA (US)

(72) Inventors: Adithya Bhaskaran, Austin, TX (US); Mukund Narasimhan, Bangalore (IN); Shiba Narayan Mohanty, Bhubaneswar (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 17/039,845

(22) Filed: Sep. 30, 2020

(65) Prior Publication Data

US 2021/0020234 A1 Jan. 21, 2021

Related U.S. Application Data

(62) Division of application No. 16/269,463, filed on Feb. 6, 2019, now Pat. No. 10,832,764.

(51) Int. Cl.
| | |
|---|---|
| *G11C 11/419* | (2006.01) |
| *G11C 7/12* | (2006.01) |
| *G11C 5/14* | (2006.01) |
| *G05F 3/26* | (2006.01) |

(52) U.S. Cl.
CPC ............ *G11C 11/419* (2013.01); *G05F 3/262* (2013.01); *G11C 5/14* (2013.01); *G11C 7/12* (2013.01)

(58) Field of Classification Search
CPC ......... G05F 3/262; G11C 11/419; G11C 5/14; G11C 7/12
USPC .......................................................... 365/203
See application file for complete search history.

(56) References Cited

U.S. PATENT DOCUMENTS

| | | | | |
|---|---|---|---|---|
| 7,292,484 | B1 * | 11/2007 | Andre | ...................... G11C 7/02 365/189.03 |
| 8,085,067 | B1 | 12/2011 | Stiff et al. | |
| 8,188,802 | B2 | 5/2012 | Garcia et al. | |
| 8,373,446 | B2 | 2/2013 | Manohar et al. | |
| 9,189,052 | B2 * | 11/2015 | Bhatia | ...................... G06F 12/06 |
| 9,406,359 | B2 | 8/2016 | Park et al. | |
| 9,411,391 | B2 * | 8/2016 | Bhatia | ...................... G11C 5/14 |
| 9,411,392 | B2 * | 8/2016 | Bhatia | ................... G06F 1/3203 |
| 10,020,047 | B2 | 7/2018 | Hunt-Schroeder et al. | |
| 2015/0227186 | A1 * | 8/2015 | Bhatia | ...................... G11C 5/14 713/320 |
| 2015/0227456 | A1 * | 8/2015 | Bhatia | ................... G06F 1/3203 711/154 |
| 2015/0228312 | A1 * | 8/2015 | Bhatia | ................... G06F 1/3203 365/227 |
| 2020/0251163 | A1 | 8/2020 | Bhaskaran | |

* cited by examiner

*Primary Examiner* — Harry W Byrne
(74) *Attorney, Agent, or Firm* — Haynes and Boone, LLP

(57) ABSTRACT

A memory is provided that includes a current mirror that controls the amount of current conducted by a head-switch transistor for a memory power supply rail during a core-power-lowering write assist period.

7 Claims, 6 Drawing Sheets

LOW-POWER AND HIGH-DENSITY CORE-POWER LOWERING FOR MEMORY WRITE ASSIST

CROSS REFERENCE TO RELATED APPLICATIONS

The present application is a divisional application of U.S. Non-Provisional patent application Ser. No. 16/269,463, filed Feb. 6, 2019, which is hereby incorporated by reference in its entirety.

TECHNICAL FIELD

This application relates to the memories with write assist, and more particularly to a core power.

BACKGROUND

As compared to dynamic random access memory (DRAM), a static random access memory (SRAM) bitcell is actively powered and thus retains its state without the need for refresh cycles. In addition, the active nature of an SRAM bitcell enables it to drive its data signal onto the corresponding bit lines so that SRAM operation is inherently faster than that for a comparable DRAM. But the powering of an SRAM cell introduces its own issues. In particular, each SRAM bitcell is formed by a pair of cross-coupled inverters. Depending upon the binary state of the stored bit, a p-type metal-oxide semiconductor (PMOS) transistor in one of the cross-coupled inverters is switched on to charge its drain to the power supply voltage. This switched-on PMOS transistor must be switched off by the action of an n-type metal-oxide semiconductor (NMOS) access transistor should a write cycle need to change the binary content for the bitcell. At the beginning of the write cycle, the NMOS access transistor begins to discharge the drain of the PMOS transistor. But the PMOS transistor is still attempting to charge its drain such that there is a 'tug of war' between the PMOS and NMOS transistors.

This NMOS/PMOS struggle thus lowers the SRAM write speed. One conventional way to increase speed is to make the NMOS access transistors relatively large with respect to the PMOS inverter transistors. But such an increase in transistor size lowers the memory density and thus demands expensive die area for its implementation. To improve memory speed without excessive die area demands, various write assist techniques have been developed. One such technique is denoted as core power lowering (CPL). An example SRAM 100 including a column power supply rail 105 for supplying a core memory power supply voltage (vddhx_core<0>) for a zeroth column (not illustrated) of bitcells is shown in FIG. 1. Column power supply rail 105 couples to a power supply node 110 supplying a memory power supply voltage vddmx a through a p-type metal-oxide semiconductor (PMOS) head-switch transistor P1. A sleep mode signal Slp_core controls the gate of transistor P1 so that head-switch transistor P1 is on during normal operation. Outside of a CPL write assist period, the core memory power supply voltage equals the memory power supply voltage vddmx due to the action of head-switch transistor P1 being fully on. During a CPL write assist period, an n-type metal-oxide semiconductor (NMOS) CPL transistor M1 switches on in response to a CPL enable signal CPL_en to conduct a DC current to ground to lower the core memory power supply voltage. CPL transistor M1 couples to column power supply rail 105 through a PMOS column multiplexing transistor P2 that is switched on in response to a column multiplexing signal Wm_n<0>. The lowering of the core memory power supply voltage weakens the PMOS transistor in the bitcell (not illustrated) powered by this voltage. An NMOS access transistor (not illustrated) can thus more quickly flip a bitcell in which the power supply voltage is reduced through CPL write assist techniques.

Prior to the write operation, the CPL transistor M1 is off so that the core memory power supply voltage is maintained at its default level (equaling the memory power supply voltage vddmx). But during a write assist period, the CPL transistor M1 switches on to lower the core memory power supply voltage. The CPL transistor M1 is relatively small as compared to the head-switch transistor P1 so that the core memory power supply voltage is not discharged to ground during the write assist period but instead is lowered by some factor (e.g., approximately 100 mV). Although CPL write assist thus advantageously increases operating speed, it comes at the cost of an appreciable power discharge to ground from power supply node 110 during the write assist period.

Accordingly, there is a need in the art for CPL write assist schemes with reduced power consumption.

SUMMARY

A memory includes a current mirror to control the current conducted by a head-switch transistor for a memory power supply rail. During a CPL write assist period, a core memory power voltage for the memory power supply rail is reduced while the head-switch transistor is controlled by the current mirror. A current discharged to ground while the core memory power voltage is reduced is thus controlled by the current mirror to lower power consumption.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To reduce the power consumption during core-power lowering (CPL) writes assist periods, a head-switch transistor for a column power supply rail is controlled by a current mirror to conduct a reduced saturation current. The head-switch transistor couples between the column power supply rail and a power supply node for a memory power supply voltage. The following discussion will be directed to two main embodiments. In a first embodiment, a CPL transistor couples between the core memory power supply rail and ground. Since the head-switch transistor is limiting the amount of current from the primary power supply rail, the current conducted by the CPL transistor equals the same mirrored current conducted by the head-switch transistor during the CPL write assist period. The current mirror thus controls the amount of current discharged by the CPL transistor during the CPL write assist period. To improve density, the current mirror may control the head-switch transistor for each column in a memory array (each column having its column power supply rail). In a second embodiment, a process tracking circuit controls a reference current conducted by the current mirror that is then mirrored to control the head-switch transistors. Due to this process tracking, there is no need for a CPL transistor such that the pull-up current from the bitcells being written to during the CPL write assist period provides the core power lowering of the core memory power supply voltage. The first main embodiment will be discussed first followed by a discussion of the second main embodiment.

Figure 1:
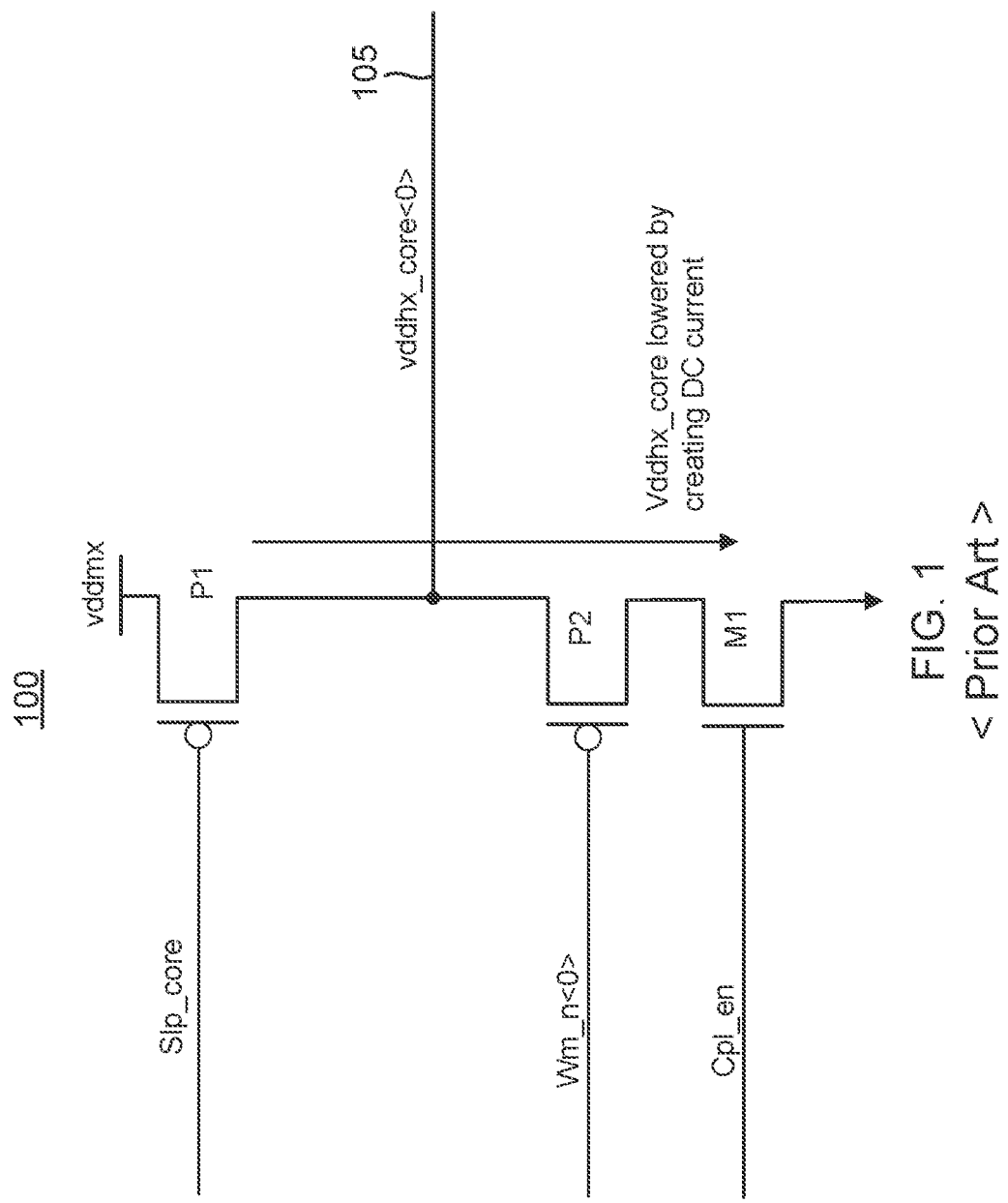
FIG. 1 illustrates a conventional CPL write assist circuit for a memory power supply rail.
Figure 2A:
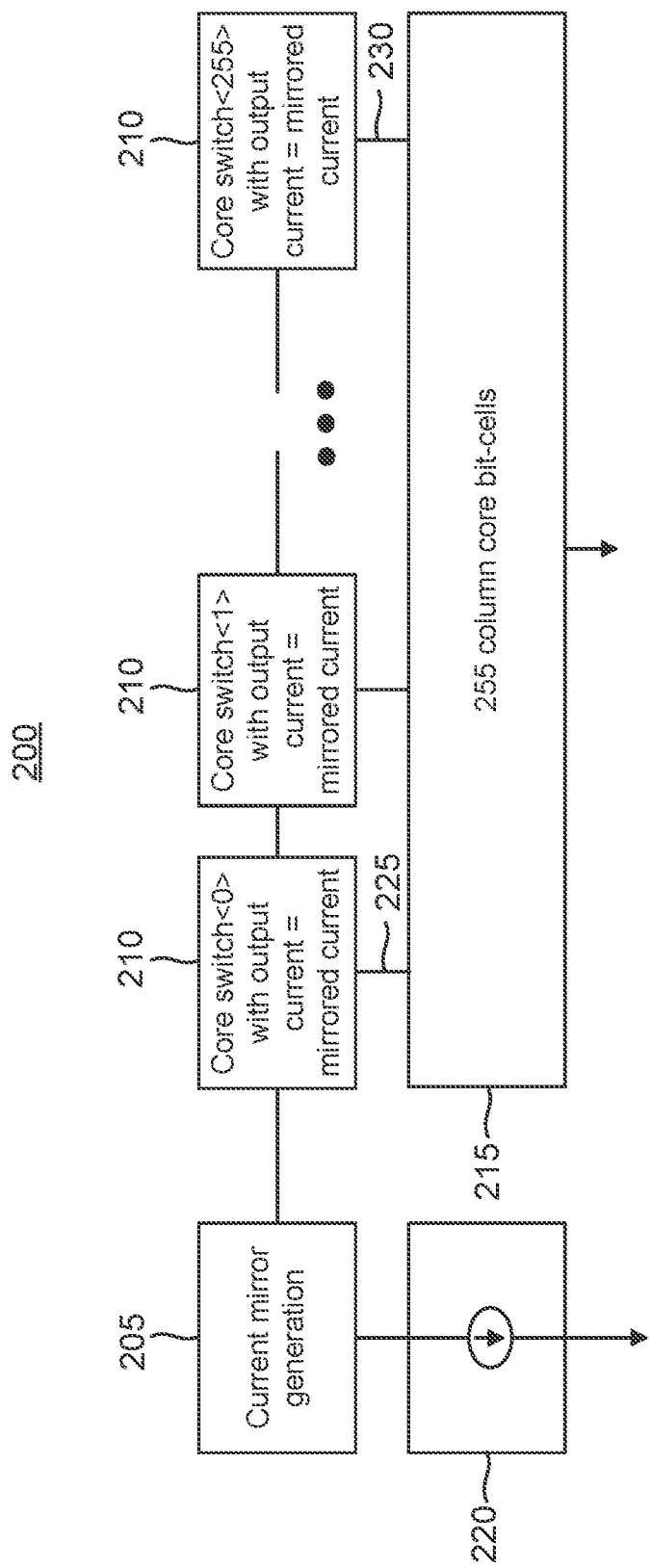
FIG. 2A illustrates a memory including a current mirror for controlling the current conducted by a plurality of head-switches for a corresponding plurality of column power supply rails during a CPL write assist period in accordance with an aspect of the disclosure.

An example memory 200 is shown in FIG. 2A. Memory 200 includes 256 column power supply rails ranging from a zeroth column power supply rail 225 to a two-hundred-fifty-fifth column power supply rail 230. Each column power supply rail supplies a core memory power supply voltage to a corresponding column of bitcells in a plurality of bitcells 215. To provide power to the column power supply rails, each column power supply rail couples to a memory power supply node (not illustrated) for a memory power supply voltage through a corresponding CPL circuit 210. During a CPL write assist period, a current mirror 205 controls a head-switch transistor (discussed further below) in each CPL circuit 210 to conduct a CPL current in a saturation mode of operation. Current mirror 205 mirrors a reference current from a current source 220 to control the CPL current conducted by the head-switch transistors during the CPL write assist period. The CPL transistors (discussed further below) in CPL circuits 210 for the active column power supply rails will thus conduct a controlled amount of current as controlled by current mirror 205 to increase the power efficiency of memory 200 despite the current discharge during the CPL write assist periods.

Figure 2B:
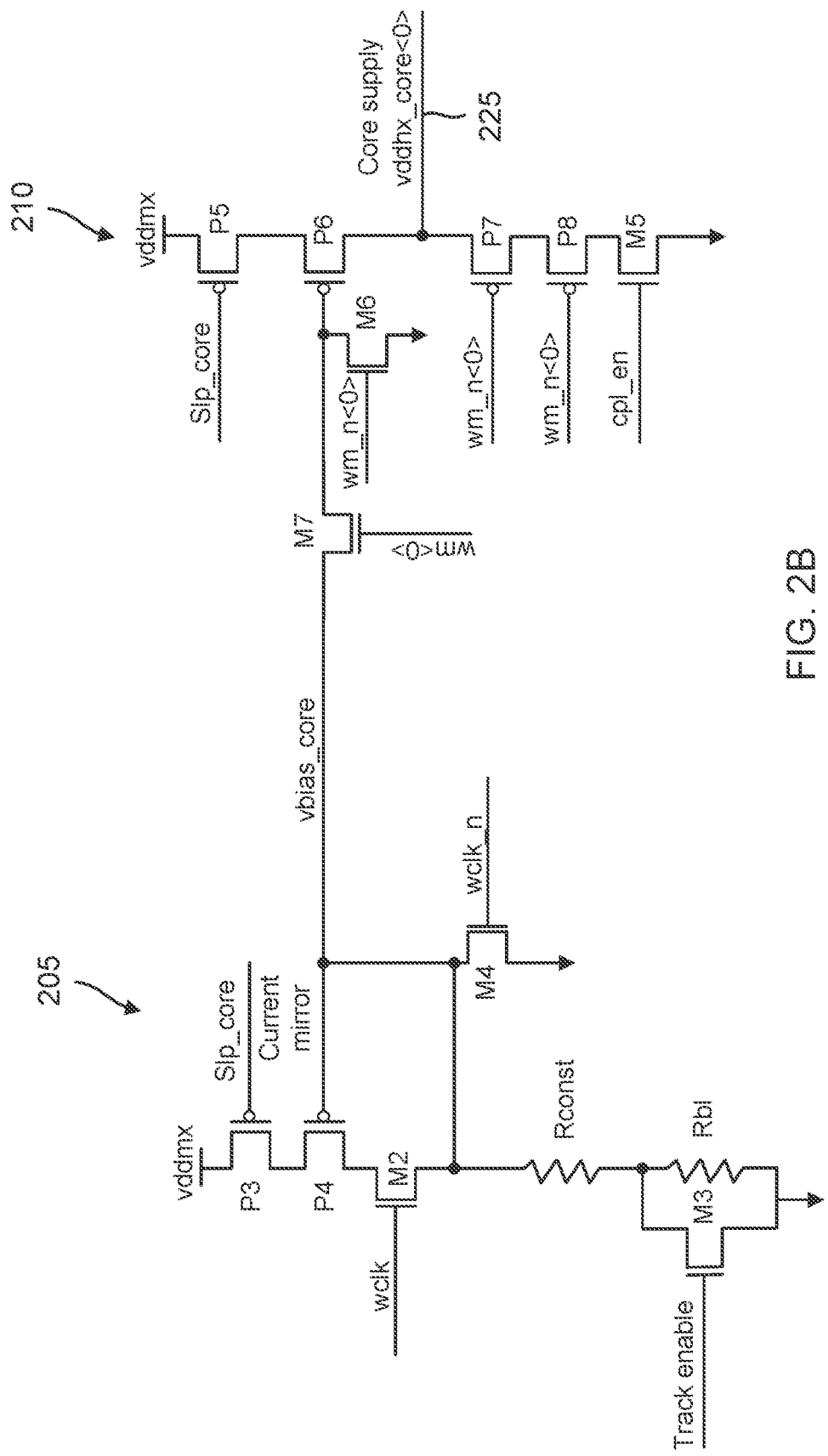
FIG. 2B is a circuit diagram for the current mirror and a CPL circuit for the memory of FIG. 2A.

Current mirror 205 and a CPL circuit 210 for zeroth column power supply rail 225 are shown in more detail in FIG. 2B. Note that current mirror 205 need only be implemented once to control a plurality of additional column power supply rails such as shown for memory 200. Current mirror 205 controls the current conducted by a PMOS head-switch transistor P6 to lower a core memory power supply voltage (vddhx_core<0>) for zeroth column power supply rail 225 during a CPL write assist period. For the embodiments disclosed herein, the CPL write assist period has the same duration as the write period occurring while a write clock (wclk) is asserted. However, it will be appreciated that the CPL write assist period may be made shorter than the write period in alternative embodiments.

Current mirror 205 generates a bias voltage (vbias_core) for controlling the gate of head-switch transistor P6 during the write period. A diode-connected PMOS transistor P4 generates the bias voltage. In a column multiplexing embodiment, the bias voltage can drive the gate of head-switch transistor P6 only when the corresponding column (in this case, the zeroth column) has been selected during a write operation. For example, a column multiplexing signal wm<0> is asserted to select the zeroth column. Note that the CPL write assist techniques and circuits disclosed herein may be practiced independently of whether the columns are multiplexed. Column multiplexing signal wm<0> drives a gate of an NMOS column multiplexing transistor M7 that couples between the gate of diode-connected transistor P4 and the gate of head-switch transistor P6 so that the bias voltage flows through column-multiplexing transistor M7 to charge the gate of head-switch transistor P6 when the column multiplexing signal wm<0> is asserted.

During a default state in which the zeroth column is not selected by the column multiplexing, a complement of the column multiplexing signal (wm_n<0>) is asserted to drive the gate of an NMOS complement column multiplexing transistor M6 that couples between ground and the gate of head-switch transistor P6. Head-switch transistor P6 is thus fully on during such a default state so that the core memory power supply voltage for zeroth column power supply rail 225 is charged to the memory power supply voltage vddmx. Should the zeroth column be selected by the column multiplexing signal, transistor M6 is off to allow the CPL write assist period to proceed while the write clock signal is asserted. The write clock signal drives a gate of an NMOS switch transistor M2 that couples between a drain of diode-connected transistor P4 and its gate. Diode-connected transistor P4 is thus diode connected only when the write clock is asserted to switch on switch transistor M2. The source of diode-connected transistor P4 connects to the power supply node for the core memory power supply voltage vddmx through a PMOS sleep transistor P3. An active-high sleep enable signal drives the gate of sleep transistor P3 so that sleep transistor P3 switches on when the sleep mode is not active. Should the sleep mode be asserted, sleep transistor P3 shuts down to isolate current mirror 205 from the power supply node.

Figure 3A:
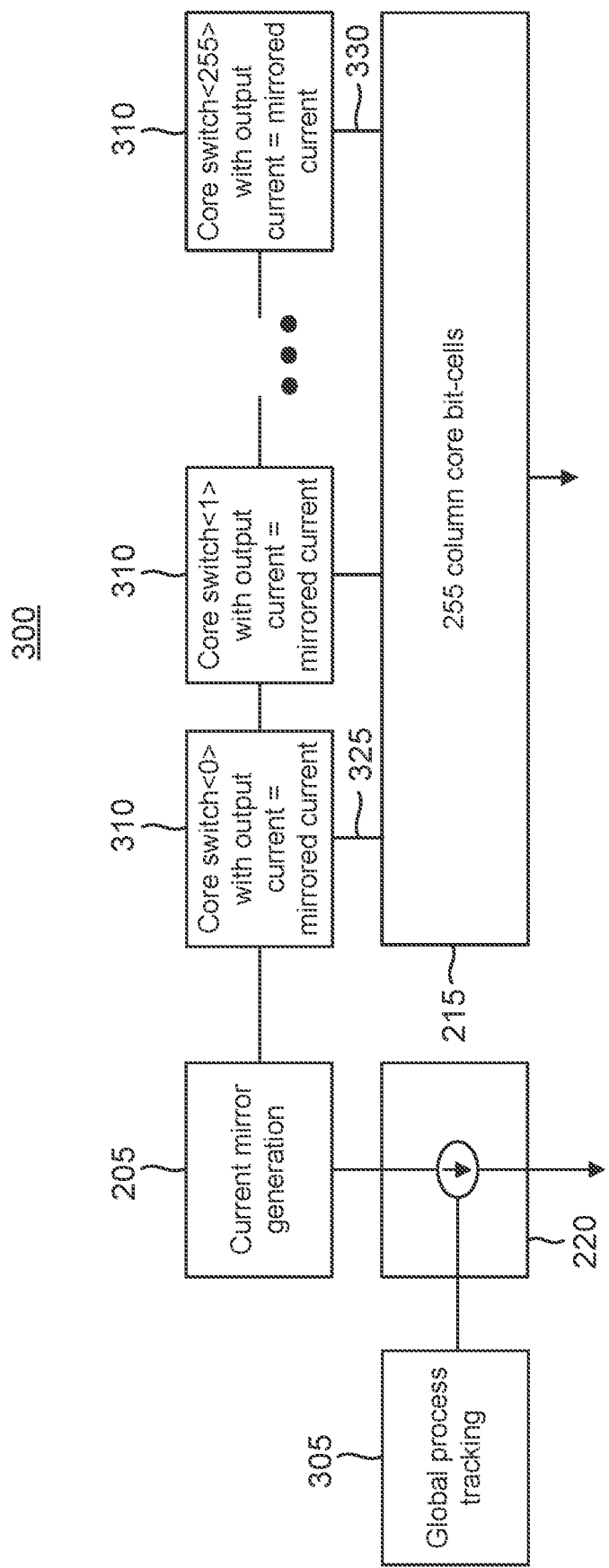
FIG. 3A illustrates a memory in which a process tracking circuit controls the current conducted by a current mirror that is mirrored to control the current conducted by a plurality of head-switches for a corresponding plurality of column power supply rails during a CPL write assist period in accordance with an aspect of the disclosure.

Switch transistor M2 not only forms a diode connection for diode-connected transistor P4 but has its source connected to a current source resistor (Rconst) that couples to ground through a bit line resistor Rbl. The current source resistor controls the reference current conducted by diode-connected transistor P4 during the write period and thus acts as current source 220 of memory 300 (FIG. 3A). Bit line resistor Rbl may be shorted out through an NMOS transistor M3 depending upon the state of an active-low track enable signal that drives the gate of transistor M3. Bit line resistor Rbl duplicates or mimics the bit line resistance of a bit line (not illustrated) for the zeroth column. If the track enable signal is active, the combined resistance of the bit line resistor and the current source resistor controls the magnitude of the reference current discharged by diode-connected transistor P4 during the write period. If the track enable signal is not active, transistor M3 switches on so that it is only the resistance for the current source resistor that controls the magnitude of the reference current conducted by diode-connected transistor P4 during the write period. The diode connection for diode-connected transistor P4 is broken when the write clock is low since switch transistor M2 switches off. At the same time, the gate of transistor P4 is grounded through an NMOS switch transistor M4 that switches on in response to a complement of the write clock signal (wclk_n).

During the write period, diode-connected transistor P4 controls the magnitude of the bias voltage depending upon the magnitude of the reference current conducted by diode-connected transistor P4. The bias voltage drives the gate of head-switch transistor P6 to then conduct the same amount of current (or a scaled version) depending upon the relative size of head-switch transistor P6 as compared to a size for diode-connected transistor P4. As discussed analogously for sleep transistor P3, the source of head-switch transistor P6 couples to the power supply node through a PMOS sleep transistor P4 that is also controlled by the sleep signal (Slp_core). The source of head-switch transistor P6 is thus coupled to the power supply node during normal operation but is isolated from the power supply node during the sleep mode. A drain of head-switch transistor P6 couples to ground through a serial combination of a first PMOS complement column multiplexing transistor P7, a second PMOS complement column multiplexing transistor P8, and an NMOS CPL transistor M5. First and second complement column multiplexing transistors P7 and P8 may be combined into a single transistor in alternative embodiments. The complement of the column multiplexing signal (wm_n<0>) drives the gates of first and second complement column multiplexing transistors P78 and P9 so that these transistors are switched on when zeroth column is selected during the column multiplexing. A CPL enable signal (cpl_en) drives the gate of CPL transistor M5 so that this transistor conducts during the write period (or a portion of the write period depending upon whether the CPL write assist period is the same length or shorter than the write period). During the CPL write assist period, the drain voltage for head-switch transistor P6 is thus lowered from the memory power supply voltage vddmx due to the current discharge through CPL transistor M5 to ground. Zeroth column power supply rail 225 connects to the drain of head-switch transistor P6 so that the core memory power supply voltage vddhx_core<0> is also lowered accordingly. But note that the current discharged by CPL transistor M5 is limited by the current conducted by head-switch transistor P6. The bias voltage causes the head-switch transistor P6 to conduct this limited current such as in the saturation region of operation. The current discharge during the CPL write assist period is thus advantageously limited by the action of current mirror 205 and CPL circuit 210.

To provide even tighter control of the current discharge during the CPL write assist period, a global process tracking circuit may be used to control the current minor current discharge in the second main embodiment disclosed herein. An example memory 300 is shown in FIG. 3A. Depending upon the process, voltage, and temperature (PVT) corner, a global process tracking circuit 305 controls the reference current conducted by current source 220 to in turn control the amount of current mirrored by current minor 205 to each of a plurality of CPL circuits 310 for a corresponding plurality column power supply rails. The plurality of column power supply rails ranges from a zeroth column power supply rail 325 to a two-hundred-fifty-fifth column power supply rail 330 but the number of columns does not matter with regard to the CPL write assist techniques and circuits disclosed herein. Advantageously, current minor 205, global process tracking circuit 305 and current source 220 need be instantiated only once to control the CPL circuits 310 for such a plurality of corresponding columns.

Figure 3B:
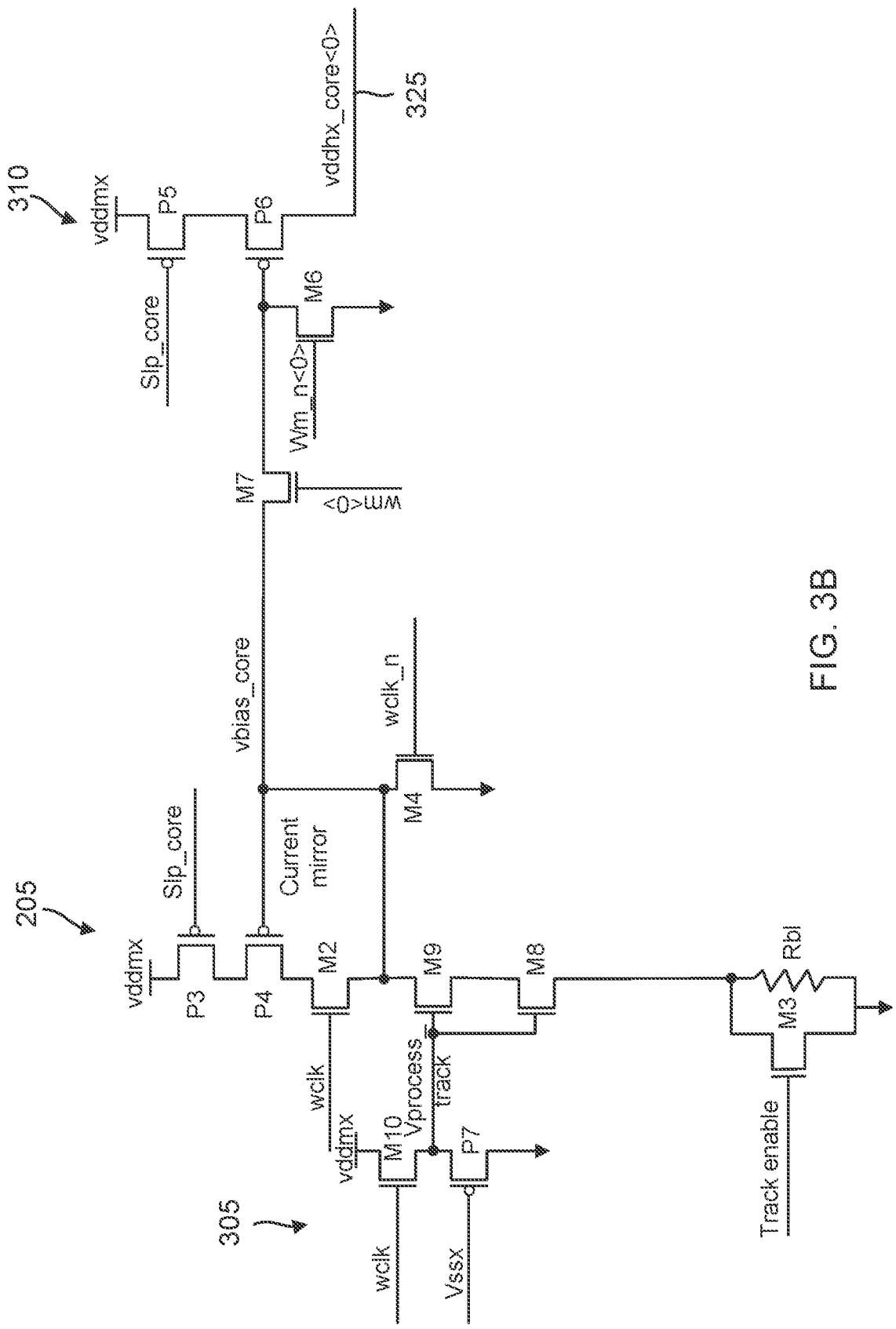
FIG. 3B is a circuit diagram for the process tracking circuit, current mirror, and a CPL circuit for the memory of FIG. 3A.

Due to the process tracking, the core memory power supply voltages for the bit lines is lowered by bitcells 215 themselves such that there is no need for any CPL transistors in CPL circuits 310. This is shown in more detail in FIG. 3B, which shown CPL circuit 310 for zeroth column power supply rail 325. The remaining CPL circuits 310 of memory 300 are constructed analogously. Current minor 205 includes the same arrangement of sleep transistor P3, diode-connected transistor P4, switch transistor M4, and switch transistor M2 as discussed with regard to memory 200. Global process tracking circuit 305 comprises an NMOS transistor M10 having its source connected to the source of a PMOS transistor P7. The drain of transistor P7 connects to ground whereas the drain of transistor M10 connects to the power supply node. The write clock signal drives the gate of transistor M10. The gate of transistor P7 is grounded. During the write period, both transistors M10 and P7 will thus be on. A process tracking voltage (Vprocess_tracking) at the sources of transistors M10 and P7 will then depend upon the relative PMOS vs. NMOS strength at the process, voltage, and temperature corner for memory 300. If transistor M10 is stronger than transistor P7, the process tracking voltage will be charged towards the memory power supply voltage vddmx. Conversely, if transistor P7 is stronger than transistor M10, the process tracking voltage will be discharged towards ground. The process tracking voltage will thus be a voltage that is greater than ground and less than the memory power supply voltage depending upon the relative PMOS/NMOS strengths.

The process tracking voltage drives the gates of a serial combination of an NMOS current source transistor M9 and an NMOS current source transistor M8. Current source transistors M8 and M9 may be combined in alternative embodiments. Current source transistors M8 and M9 form current source 220 of FIG. 3A. The drain of current source transistor M9 connects to the source of switch transistor M2. As discussed analogously for memory 200, the source of current source transistor M8 couples to ground through bit line tracking resistor Rbl when transistor M3 is off. Transistor M3 shorts out bit line tracking resistor Rbl when the track enable signal is charged high. When transistor M3 is off, the bit line resistance and current source transistors M8 and M9 control the current conducted by diode-connected transistor P4 while the write clock signal is high. If transistor M3 is on, only the current source transistors M8 and M9 control the current conducted by diode-connected transistor P4. Should the bit line resistance be selected, the current conducted by diode-connected transistor P4 will be reduced if the resistance of a bit line (not illustrated) for the zeroth column is relatively large.

CPL circuit 310 includes sleep transistor P5, head-switch transistor P6, complement column multiplexing transistor M6, and column multiplexing transistor M7 arranged as discussed with regard to CPL circuit 210. But due to the process tracking by global process tracking circuit 305, CPL circuit 310 needs no equivalent of CPL transistor M5 (and thus does not need complement column multiplexing transistors P7 and P8). Instead, it is the pull-up current for written-to ones of bitcells 215 (FIG. 3A) during the CPL write assist period that lowers the core memory power supply voltage for zeroth column power supply rails 325. This pull-up current discharge of the core memory power supply voltage is gated or controlled by the biasing of head-switch transistor P6 from current mirror 205. The bitcells that conduct the pull-up current for memory 300 or CPL transistor M5 in memory 200 may each be deemed to form a means for lowering the core memory power supply voltage during the core-power-lowering right assist period. With regard to such pull-up current discharge, global process tracking circuit 305 may be implemented in alternative embodiments using one or more dummy bitcells (not illustrated). The dummy bit line voltages for the dummy bitcells would be grounded whereas the dummy word line voltage would be asserted. The resulting bitcell fight current for the dummy bitcells would then track the process corner such that the dummy bitcells would function as the current source 220 and global process tracking circuit 305 of memory 300.

Figure 4:
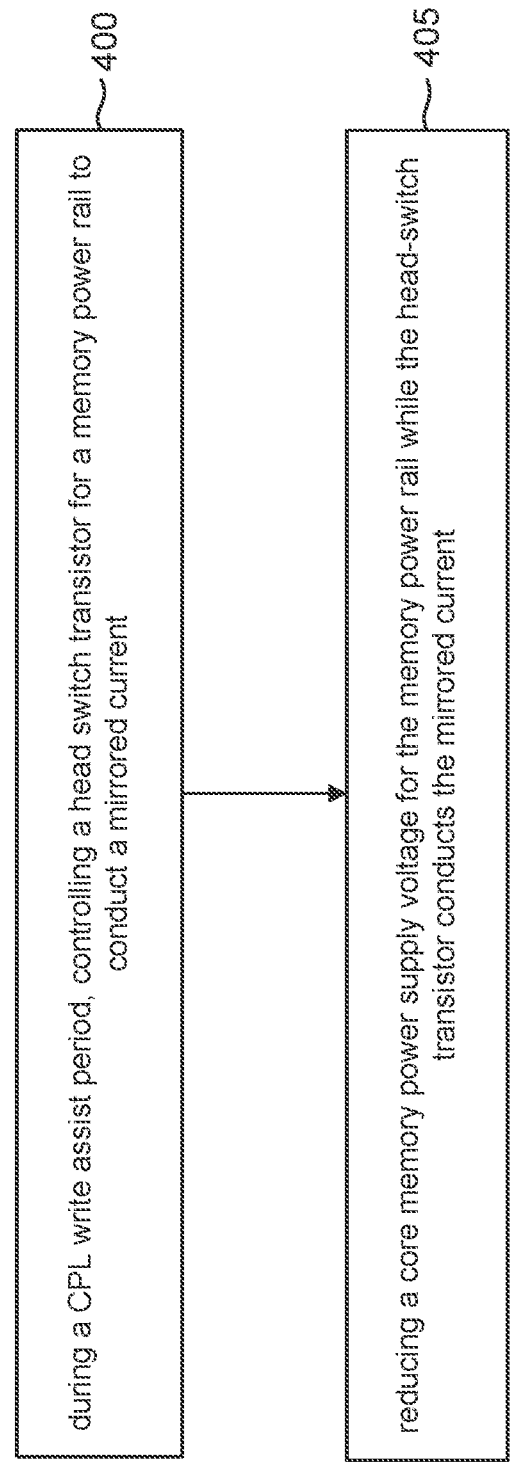
FIG. 4 is a flowchart for a core-power-lowering of a core memory power supply voltage in accordance with an aspect of the disclosure.

A core-power lowering (CPL) write assist method for a memory will now be discussed with reference to the flowchart of FIG. 4. The method includes an act 400 that occurs during a CPL write assist period and includes controlling a head-switch transistor for a memory power supply rail to conduct a mirrored current. The control of head-switch transistor P6 in CPL circuits 210 and 310 by the bias voltage from current mirror 205 is an example of act 400. The method further includes an act 405 reducing a core memory power supply voltage for the memory power supply rail while the head-switch transistor conducts the mirrored current. The switching on of CPL transistor M5 in CPL circuit 210 or the conducting of the pull-down current by the written-to bitcell for memory 300 both are examples of reducing the core memory power supply voltage while head-switch transistor P6 conducts.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A core-power lowering (CPL) write assist method for a memory, comprising:
   during a CPL write assist period, controlling a head-switch transistor for a memory power supply rail to conduct a mirrored current; and
   reducing a core memory power supply voltage for the memory power supply rail while the head-switch transistor conducts the mirrored current.

2. The CPL write assist method of claim 1, wherein reducing the core memory power supply voltage comprises switching on a CPL write assist transistor coupled between the memory power supply rail and ground to conduct a current limited by the mirrored current conducted by the head-switch transistor.

3. The CPL write assist method of claim 1, wherein reducing the core memory power supply voltage comprises writing to a bitcell connected to the memory power supply rail so that the bitcell conducts a pull-up current.

4. The CPL write assist method of claim 3, further comprising:
   controlling a current source transistor to conduct a process tracking current responsive to a process corner for the memory
   conducting the process tracking current through a diode-connected transistor to generate a bias voltage; and
   controlling the head-switch transistor to conduct the mirrored current by driving a gate of the head-switch transistor with the bias voltage.

5. The CPL write assist method of claim 3, further comprising:
   switching on a switch transistor to form a diode connection for the diode-connected transistor responsive to a write clock signal for the memory.

6. The CPL write assist method of claim 2, further comprising:
   conducting a reference current through a diode-connected transistor to generate a bias voltage while controlling a magnitude of the reference current with a current source resistor; and
   controlling the head-switch transistor to conduct the mirrored current by driving a gate of the head-switch transistor with the bias voltage.

7. The CPL write assist method of claim 6, further comprising:
   controlling the magnitude of the reference current with a bit line resistor, wherein a resistance for the bit line resistor duplicates a resistance for a bit line in the memory.

* * * * *